US008149256B2

(12) United States Patent
Fish et al.

(10) Patent No.: US 8,149,256 B2
(45) Date of Patent: Apr. 3, 2012

(54) TECHNIQUES FOR CHANGING TEMPERATURE OF A PLATEN

(75) Inventors: Roger B. Fish, Bedford, MA (US); Samuel M. Barsky, Wakefield, MA (US); Scott C. Holden, Melrose, MA (US); Arthur P. Riaf, Gloucester, MA (US); Steven M. Anella, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 770 days.

(21) Appl. No.: 12/132,939

(22) Filed: Jun. 4, 2008

(65) Prior Publication Data

US 2009/0303306 A1    Dec. 10, 2009

(51) Int. Cl.
*H01J 37/08* (2006.01)
(52) U.S. Cl. ............... 347/207; 250/443.1; 250/492.21
(58) Field of Classification Search .......... 347/171, 347/185, 207, 220
See application file for complete search history.

(56) References Cited

U.S. PATENT DOCUMENTS

| | | | |
|---|---|---|---|
| 5,034,688 A * | 7/1991 | Moulene et al. | 324/750.03 |
| 5,338,940 A | 8/1994 | Takeyama | |
| 6,095,898 A * | 8/2000 | Hennhofer et al. | 451/7 |
| 6,306,009 B1 * | 10/2001 | Sandhu et al. | 451/7 |
| 6,544,111 B1 * | 4/2003 | Kimura et al. | 451/288 |
| 6,583,428 B1 | 6/2003 | Chipman et al. | |
| 6,814,831 B2 * | 11/2004 | Drake | 156/230 |
| 7,279,048 B2 | 10/2007 | Shinma et al. | |
| 7,977,652 B2 * | 7/2011 | Fish et al. | 250/492.21 |
| 2008/0121821 A1 * | 5/2008 | Muka et al. | 250/492.21 |
| 2009/0061745 A1 * | 3/2009 | Heinrich et al. | 451/289 |
| 2009/0170320 A1 * | 7/2009 | Heinrich et al. | 438/692 |

FOREIGN PATENT DOCUMENTS

| | | |
|---|---|---|
| JP | 05028951 A | 2/1993 |
| JP | 2001068427 A | 3/2001 |

* cited by examiner

*Primary Examiner* — Daniel Petkovsek

(57) ABSTRACT

Techniques for changing temperature of a platen are disclosed. In one particular exemplary embodiment, the techniques may be realized as an apparatus for changing temperature of a platen comprising a platen and one or more movable thermal pads comprising one or more thermal fluid channels to carry a thermal fluid configured to affect a temperature of the platen.

17 Claims, 9 Drawing Sheets

TECHNIQUES FOR CHANGING TEMPERATURE OF A PLATEN

FIELD OF THE DISCLOSURE

The present disclosure relates generally to semiconductor manufacturing and, more particularly, to techniques for changing temperature of a platen.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

FIG. 1 depicts a conventional ion implanter system 100. The ion implanter 100 includes a power source 101, an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses may manipulate ion energies and cause the ion beam to hit a target workpiece 114 at a desired energy. A number of measurement devices 116 (e.g., a dose control Faraday cup, a traveling Faraday cup, or a setup Faraday cup) may be used to monitor and control the ion beam conditions.

It has been discovered that a relatively low wafer temperature during ion implantation improves implantation performance. Although low-temperature ion implantation has been attempted, conventional approaches suffer from a number of deficiencies. For example, low-temperature ion implantation techniques have been developed for batch-wafer ion implanters, while the current trend in the semiconductor industry favors single-wafer ion implanters. Batch-wafer ion implanters typically process multiple wafers (e.g., batches) housed in a single vacuum chamber. The simultaneous presence of several chilled wafers in the same vacuum chamber, often for an extended period of time, requires extraordinary in-situ cooling capability. Pre-chilling an entire batch of wafers is not an easy option since each wafer may experience a different temperature increase while waiting for its turn to be implanted. In addition, extended exposure of the vacuum chamber to low-temperature wafers may result in icing from residual moisture.

Also, almost all existing low-temperature ion implanters cool wafers directly during ion implantation. Apart from causing icing problems in a process chamber, direct cooling requires incorporation of cooling components (e.g., coolant pipelines, heat pumps, and additional electrical wirings) into a wafer platen itself. In general, modern wafer platens are already fairly sophisticated and highly optimized for room-temperature processing. As a result, modification of an existing ion implanter or designing a new ion implanter to accommodate low-temperature processes may be complicated and may have unwanted impacts on the ion implanter's ability to perform room temperature ion implantation processes.

In view of the foregoing, it may be understood that there are significant problems and shortcomings associated with current technologies for changing temperature of a platen.

SUMMARY OF THE DISCLOSURE

Techniques for changing temperature of a platen are disclosed. In one particular exemplary embodiment, the techniques may be realized as an apparatus for changing temperature of a platen. The apparatus may comprise a platen and one or more movable thermal pads comprising one or more thermal fluid channels to carry a thermal fluid configured to affect a temperature of the platen.

In accordance with other aspects of this particular exemplary embodiment, the one or more movable thermal pads may be retractable away from the platen in a direction parallel to a planar surface of the platen.

In accordance with further aspects of this particular exemplary embodiment, the one or more movable thermal pads may be independently controlled.

In accordance with additional aspects of this particular exemplary embodiment, the temperature of the platen may be affected when the one or more movable thermal pads are in thermal contact with the platen.

In accordance with other aspects of this particular exemplary embodiment, the platen and the one or more movable thermal pads may be made of an electrostatic material. For example, the electrostatic material may comprise aluminum, alumina, or other similar electrostatic material.

In accordance with further aspects of this particular exemplary embodiment, the thermal fluid may be a coolant comprising at least one of helium, nitrogen, a refrigerant liquid, and a cryogenic liquid, such that the temperature of the platen may be decreased to below 0° C. or increased to room temperature.

In another particular exemplary embodiment, the techniques may be realized as a method for changing temperature of a platen. The method may comprise feeding one or more thermal fluid channels of one or more movable thermal pads with a thermal fluid, and moving the one or more thermal pads to thermally contact a platen to change a temperature of the platen.

In accordance with other aspects of this particular exemplary embodiment, the method may further comprise introducing a small gas flow into areas where the one or more thermal pads thermally contact the platen to reduce thermal resistance and improve heat transfer.

In accordance with further aspects of this particular exemplary embodiment, the method may further comprise retracting the one or more thermal pads when a desired temperature is obtained.

In accordance with additional aspects of this particular exemplary embodiment, the one or more thermal pads may be retracted away from the platen in a direction parallel to a planar surface of the platen.

In accordance with other aspects of this particular exemplary embodiment, the one or more thermal pads may be retracted away from the platen in a direction orthogonal to a planar surface of the platen.

In accordance with further aspects of this particular exemplary embodiment, the one or more thermal pads may be independently controlled.

In accordance with additional aspects of this particular exemplary embodiment, the platen and the one or more thermal pads may be made of an electrostatic material. For example, the electrostatic material may comprise aluminum, alumina, or other similar electrostatic material.

In accordance with other aspects of this particular exemplary embodiment, the thermal fluid may be a coolant comprising at least one of helium, nitrogen, a refrigerant liquid, and a cryogenic liquid.

In accordance with further aspects of this particular exemplary embodiment, the temperature of the platen may be decreased to below 0° C.

In accordance with additional aspects of this particular exemplary embodiment, the temperature of the platen may be decreased to between −10° C. to −100° C.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
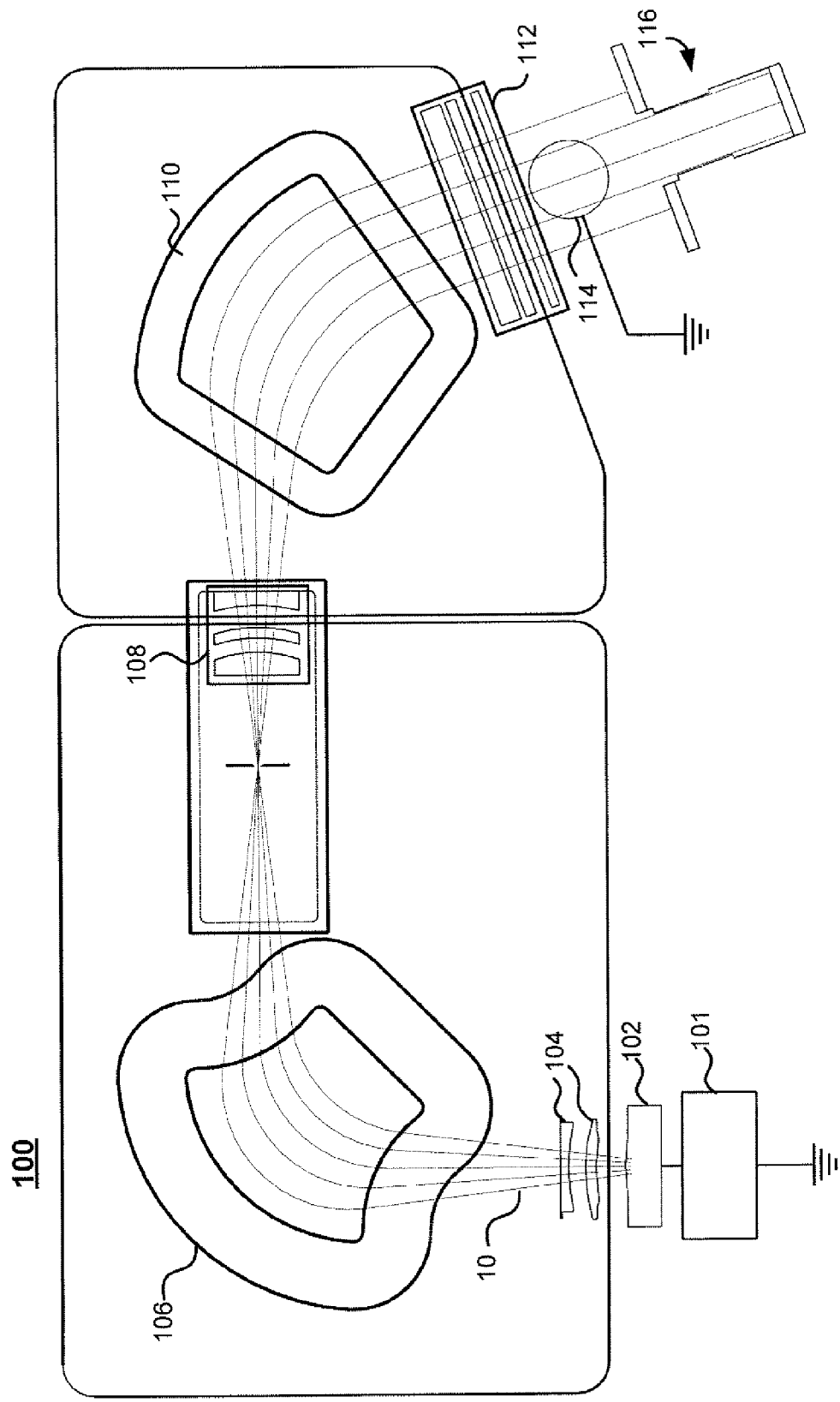
FIG. 1 depicts a conventional ion implanter.

Reference will now be made in detail to exemplary embodiments, examples of which are illustrated in the accompanying drawings. It should be appreciated that the same reference numbers will be used throughout the drawings to refer to the same or like parts. It should be appreciated that the following detailed description is exemplary and explanatory only and is not restrictive.

Embodiments of the present disclosure to provide techniques for changing temperature of platen for optimizing ion implantation and improving overall ion implantation performance. In addition, embodiments of the present disclosure provide various exemplary configurations for changing temperature of a platen.

With continued miniaturization of semiconductor devices, there has been an increased demand for ultra-shallow junctions. For example, tremendous effort has been devoted to creating better activated, shallower, and more abrupt source-drain extension junctions to meet the needs of modern complementary metal-oxide-semiconductor (CMOS) devices.

To create an abrupt, ultra-shallow junction in a crystalline silicon wafer, for example, amorphization of the wafer surface is desirable. Generally, a relatively thick amorphous silicon layer is preferred because fewer interstitials from an ion implant will remain after a solid-phase epitaxial growth as part of a post-implant anneal. A thin amorphous layer may lead to more interstitials residing in an end-of-range area beyond the amorphous-crystalline interface. These interstitials may lead to transient enhanced diffusion (TED) of ion-implanted dopants, causing a resultant dopant profile (e.g., P-N or N-P junction) to deepen and/or lose a desired abruptness. As a result, a thinner amorphous layer may adversely increase short channel effects in electronic devices. The interstitials may also lead to the formation of inactive clusters which, particularly in the case of boron, may reduce dopant activation. The interstitials beyond the amorphous-crystalline interface not removed during an activation anneal may combine to form complex end-of-range damage. This damage may lead to junction leakage and yield loss mechanisms. The damage may evolve during later thermal processes by emitting interstitials which may lead to further dopant diffusion and dopant deactivation.

It has been discovered that a relatively low wafer temperature during ion implantation is advantageous for amorphization of a silicon wafer. In current applications of ion implantation, wafers are typically cooled during the implantation process by a gas that thermally couples a wafer to a clamping platen, which has been cooled by liquid flowing from a chiller. In most cases, such cooling techniques put the wafer temperature between the chiller temperature (e.g., 15° C.) and a higher temperature having an upper limit imposed to preserve photoresist integrity (e.g., 100° C.). Such a higher temperature may enhance a self-annealing effect, e.g., the annihilation (during implant) of Frenkel pairs (vacancy-interstitial pairs created from ion beam bombardments). Since amorphization of the silicon occurs only when a sufficient number of silicon atoms are displaced by beam ions, an increase of Frenkel pair annihilation at high temperatures works against the much needed amorphization process, resulting in a higher dose threshold for amorphization and therefore less than ideal shallow junctions.

With other parameters being the same, the thickness of an amorphous silicon layer may increase with decreasing implantation temperature due to a reduction of the self-annealing effect. Thus, better process control and prediction of device performance may be achieved.

Rapid thermal anneals, in which the wafer is heated to, for example, 1000° C. in five (5) seconds, have commonly been used to activate implanted dopants. Diffusion-less anneals are becoming preferred post-implant processes, wherein the temperature of a wafer is ramped up much faster (e.g., to 1000° C. in five (5) milliseconds) using, for example, a laser or flash lamps, as a heat source. These extremely rapid thermal processes act so quickly that the dopants do not have time to diffuse significantly, but there is also less time for the implant damage to be repaired. It is believed that low-temperature ion implantation may improve the extent of implant damage repair during such diffusion-less anneals. Accordingly, techniques for changing temperature of a platen, or more specifically, to cool a platen, may be greatly desirable.

For instance, ion implantation at temperatures below −60° C. may substantially improve ion implantation process performance. While conventional ion implanters typically implant wafers at temperatures from 10 to 100° C., cooling a wafer and keeping temperature below 0° C. during ion implantation may be important in optimizing ion implantation.

Figure 2A:
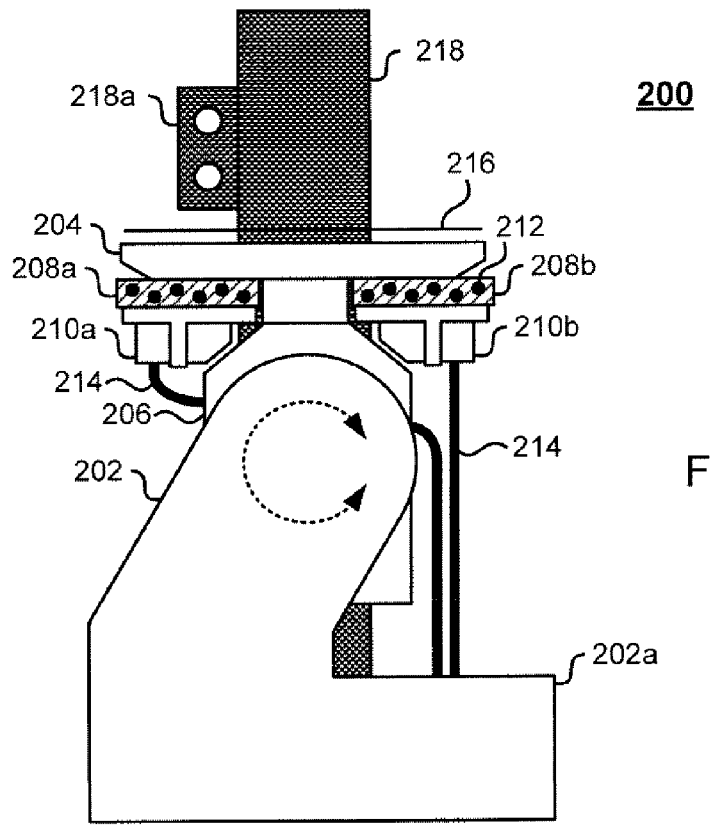
FIGS. 2A-2H depict an apparatus for changing temperature of a platen in accordance with an exemplary embodiment of the present disclosure.

FIGS. 2A-2H depict an apparatus 200 for changing temperature of a platen in accordance with an exemplary embodiment of the present disclosure. Referring to FIG. 2A, a side view of the apparatus 200 for changing temperature of a platen is shown in accordance with an exemplary embodiment of the present disclosure. The apparatus 200 may include a roplat 202 having a base 202a, a platen 204, and a motor 206 connected to the platen 204. In this example, thermal pads 208a, 208b may be provided beneath the platen 204. In one embodiment, the thermal pads 208a, 208b may be placed on and supported by movable arms 210a, 210b. The thermal pads 208a, 208b may include thermal channels 212 for thermal fluid (e.g., coolant) to flow within the thermal pads 208a, 208b. For example, as coolant flows through the thermal pads 208a, 208b, a wafer 216, which may be placed on the platen 204, may be cooled to a desired temperature. It should be appreciated that the thermal channels 212 in the thermal pads 208a, 208b may connect to one or more thermal pipes 214, which are in turn connected to a thermal fluid source and/or drain (not shown) via mounting frame 218. The mounting frame 218 may include a mounting bracket 218a for mounting to ion implantation components or other mounting objects.

Figure 2B:
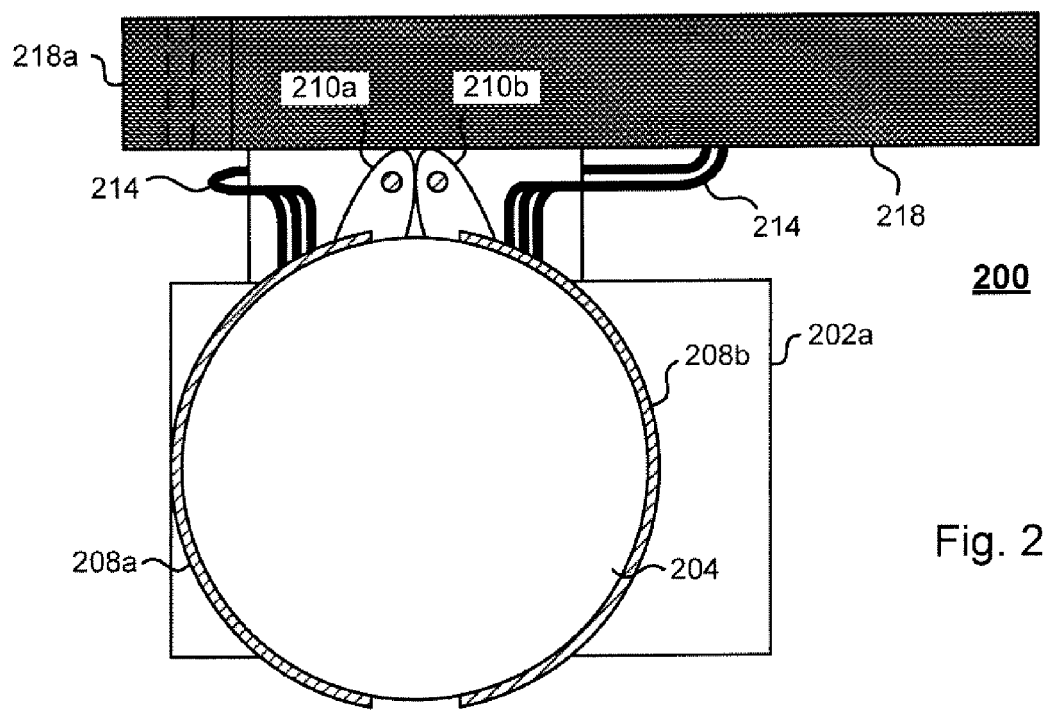

Referring to FIG. 2B, a top view of the apparatus 200 for changing temperature of the platen 204 is provided. In this view, the one or more thermal pipes 214 may be more clearly shown.

Figure 2C:
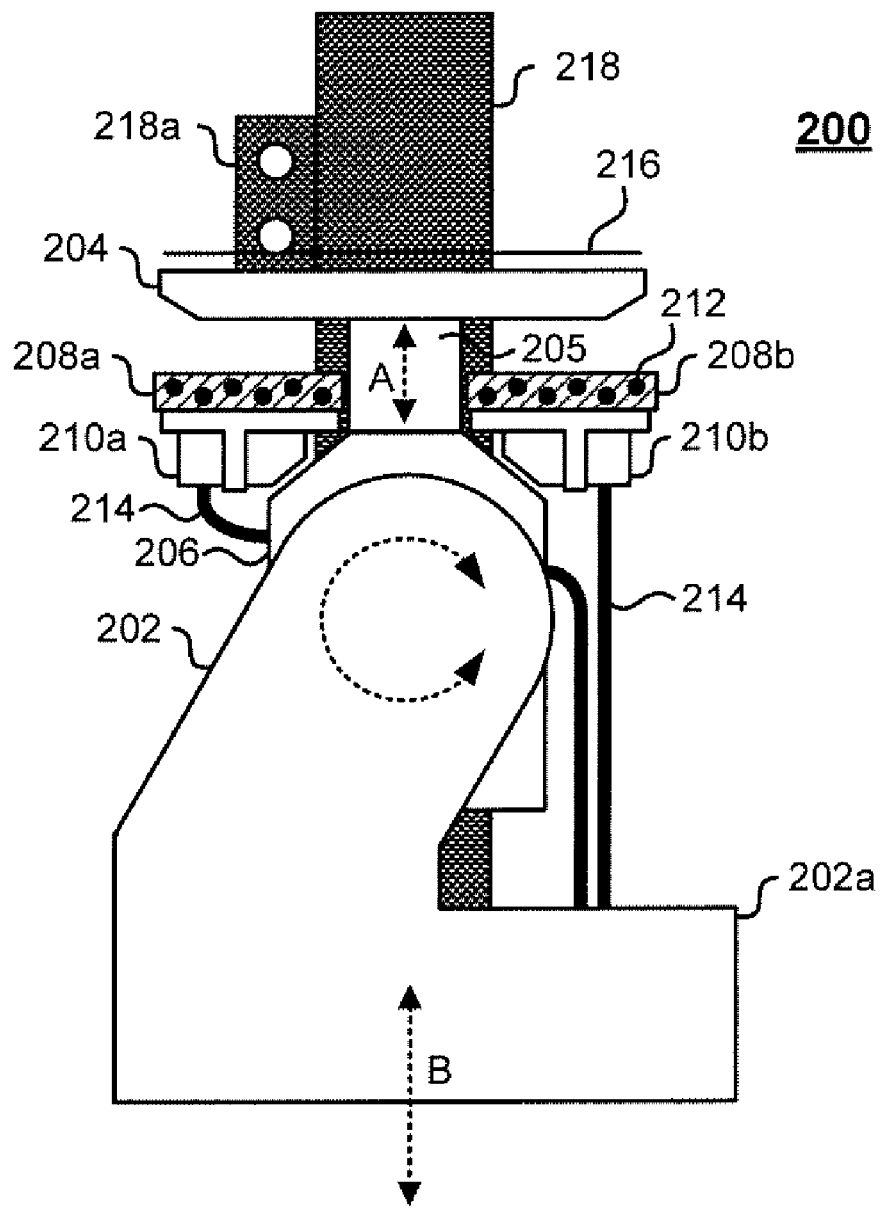

FIG. 2C depicts another side view of the apparatus 200 for changing temperature of the platen 204. In this view, it may be clearly shown that the platen 204 is connected to the motor 206 by an actuating arm 205. In one embodiment, the actuating arm 205 may be extended and/or retracted by the motor 206, as shown by arrow A. FIG. 2C depicts the platen 204/actuating arm 205 in an extended position, and FIG. 2A depicts the platen 204/actuating arm 205 in a retracted position.

Referring back to FIG. 2A, in a retracted/lowered position, the motor 206 via the actuating arm 205 may retract the platen 204 so that the underside of the platen 204 may thermally contact the thermal pads 208a, 208b. In other words, contact pressure may be applied by a downward force from the platen 204 to the thermal pads 208a, 208b by the motor 206 (e.g., a linear motor using an air bearing scan system).

In another embodiment, the platen 204 may be raised/lowered by a linear motion of the roplat 202 itself, as shown by arrow B in FIG. 2C. In this example, the roplat 202 may be raised/lowered along the mounting frame 218. Similar to the actuating arm 205, contact pressure may be applied by a downward force from the platen 204 to the thermal pads 208a, 208b by the motor 206 when the roplat 202 is lowered onto the thermal pads 208a, 208b. It should also be appreciated that an air bearing scan system may also be used to move the roplat 202 long the mounting frame 218. Other various embodiments may also be realized.

In one embodiment, changing temperature of the platen 204 may be achieved by contact heat transfer. For example, as the thermal fluid (e.g., coolant) passes through the thermal channels 212 within the thermal pads 208a, 208b, heat from the platen 204 may be transferred to the thermal fluid in the thermal pads 208a, 208b. Thus, a cooling or heating effect may result depending on the type and/or temperature of the thermal fluid.

In another embodiment, the platen 204 may be formed of an aluminum-based material, such as aluminum or alumina. In another embodiment, the upper side of the platen 204 may be alumina and the underside of the platen 204 may be aluminum. In yet another embodiment, the platen 204 may be formed of other materials and coated with an aluminum-based material. It should also be appreciated that other various platen materials may also be utilized. For example, these may include any electrostatic materials used in ion implantation.

The thermal pads 208a, 208b may also be formed of aluminum-based materials, e.g., aluminum. It should also be appreciated that the movable arms 210a, 210b, the mounting frame 218 may also be formed of aluminum-based materials, such as aluminum. Other various materials may also be utilized. The one or more thermal pipes 214 may be formed of stainless steel or other materials capable of withstanding pressure at lower temperatures.

In one embodiment, it should be appreciated that thermal resistance between the metal-to-metal contact of the platen 204 and the thermal pads 208a, 208b may be lowered by introducing a small gas flow into the contact areas. The small gas flow may be helium, nitrogen, clean dry air (CDA), or other similar gases. By introducing a small gas flow, the heat transfer may be increased between the thermal pads 208a, 208b and the platen 204 to facilitate changing the temperature of the platen 204 to the desired temperature.

The thermal fluid in the thermal pads 208a, 208b may include gas and/or liquid. For decreasing temperature of the platen 204, a coolant may be used. For example, in one embodiment, nitrogen gas may be used as the coolant. In another embodiment, the coolant may be a refrigerant liquid, such as hydrocarbon blends (e.g., Fluorinert, etc.). In yet another embodiment, a cryogenic liquid, such as $LN_2$, may be used as the coolant. Other various gases and/or liquids may also be used.

Figure 2D:
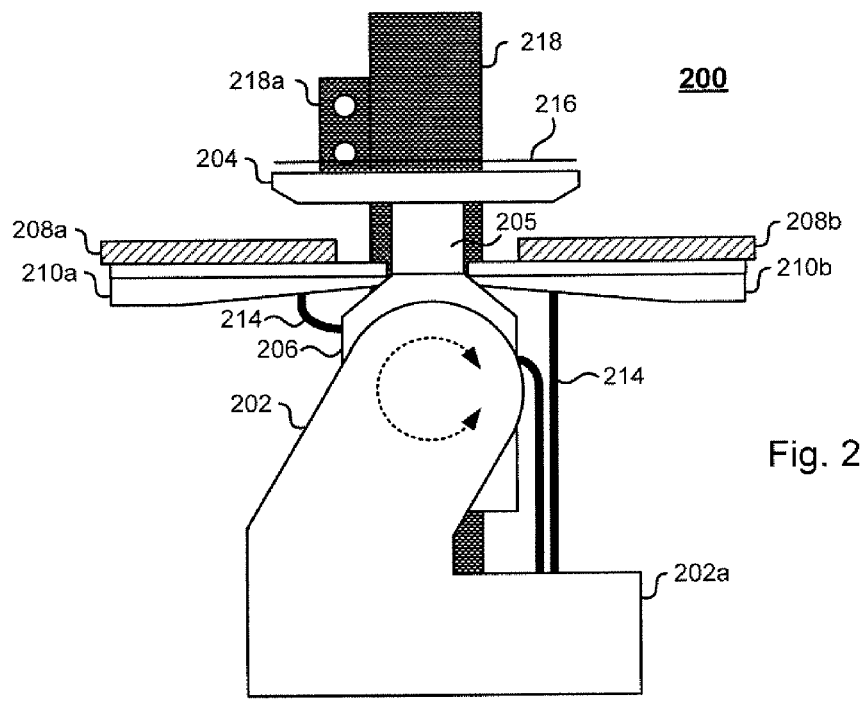
Figure 2E:
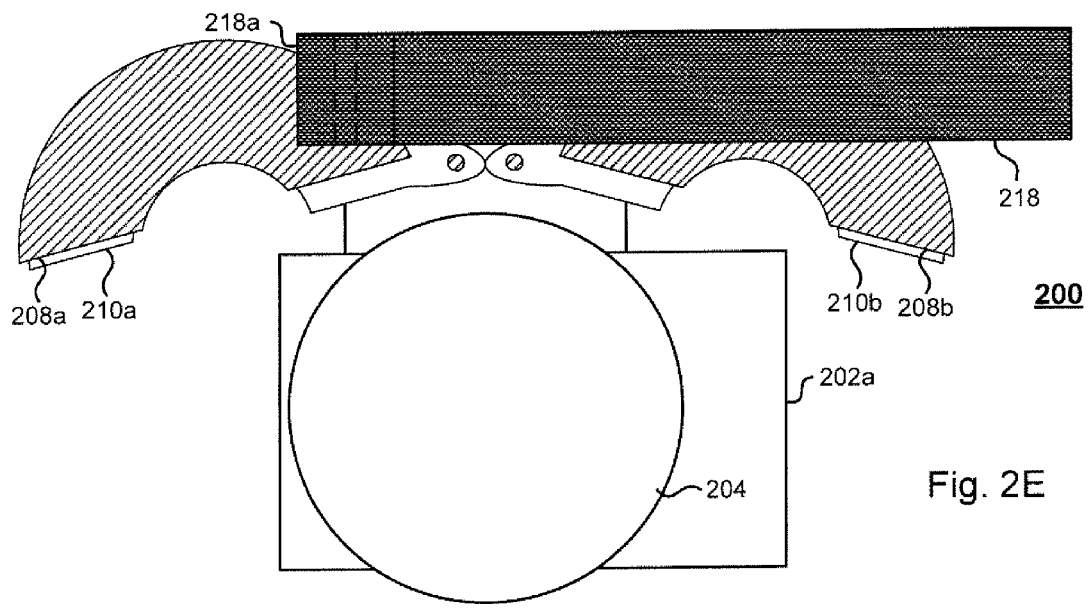

Referring to FIG. 2D, a side view of the apparatus 200 for changing temperature of the platen 204 is depicted. As described above, the thermal pads 208a, 208b may be supported by a movable arms 210a, 210b. In this view, it may be more clearly shown that the thermal pads 208a, 208b (via the movable arms 210a, 210b) may be retractable to move in parallel with the surface plane of the platen 204. In particular, the thermal pads 208a, 208b may move into parallel contact with the underside of the platen 204. FIG. 2E depicts a top view of apparatus 200 corresponding to FIG. 2D.

It should be appreciated that the apparatus 200 may also allow for normal room temperature implant operation at full throughput and/or reduced throughput for low-temperature implant operation. For example, during normal room temperature operation, the apparatus 200 may be in a retracted position (as shown in FIGS. 2D-2G) and no thermal fluid (e.g., coolant) may be flowing through the thermal channels 212 of the thermal pads 209a, 208b. Here, a conventional platen cooling system may be used to gently cool the platen 204. In order to begin a low-temperature implantation mode (e.g. cryogenic mode) in accordance with an embodiment of the present disclosure, the platen cooling system may be isolated and/or purged of water, and the thermal channels 212 and thermal pipes 214 may begin to feed coolant through the thermal pads 208a, 208b. In one embodiment, the coolant may run through the thermal pads 208a, 208b when the thermal pads 208a, 208b are in a retracted position, as shown in FIGS. 2D-2G. In another embodiment, the coolant may run through the thermal pads 208a, 208b when the thermal pads 208a, 208b are in a non-retracted (ready-to-cool) position, as shown in FIGS. 2A-2C and 2H. Once the thermal pads 208a, 208b are cooled to a desired temperature (e.g., below 0° C.), the platen 204 may be lowered by the motor 206 (e.g., via the retracting actuating arm 205 or via lowering the entire roplat 202) onto the thermal pads 208a, 208b to form thermal contact. When the temperature of the platen 204 has changed to the desired temperature, the platen 204 may be lifted off the thermal pads 208a, 208b, which may once again retract. Once the thermal pads 208a, 208b are retracted, the platen 204 may be placed in implant position for ion implantation at the low temperature. It should be appreciated that an implant position may also be achieved when the motor 206 pivots at the roplat 202 such that the surface plane of the platen 204 is no long parallel with the plane of the base 202*a* of the roplat 202.

Figure 2F:
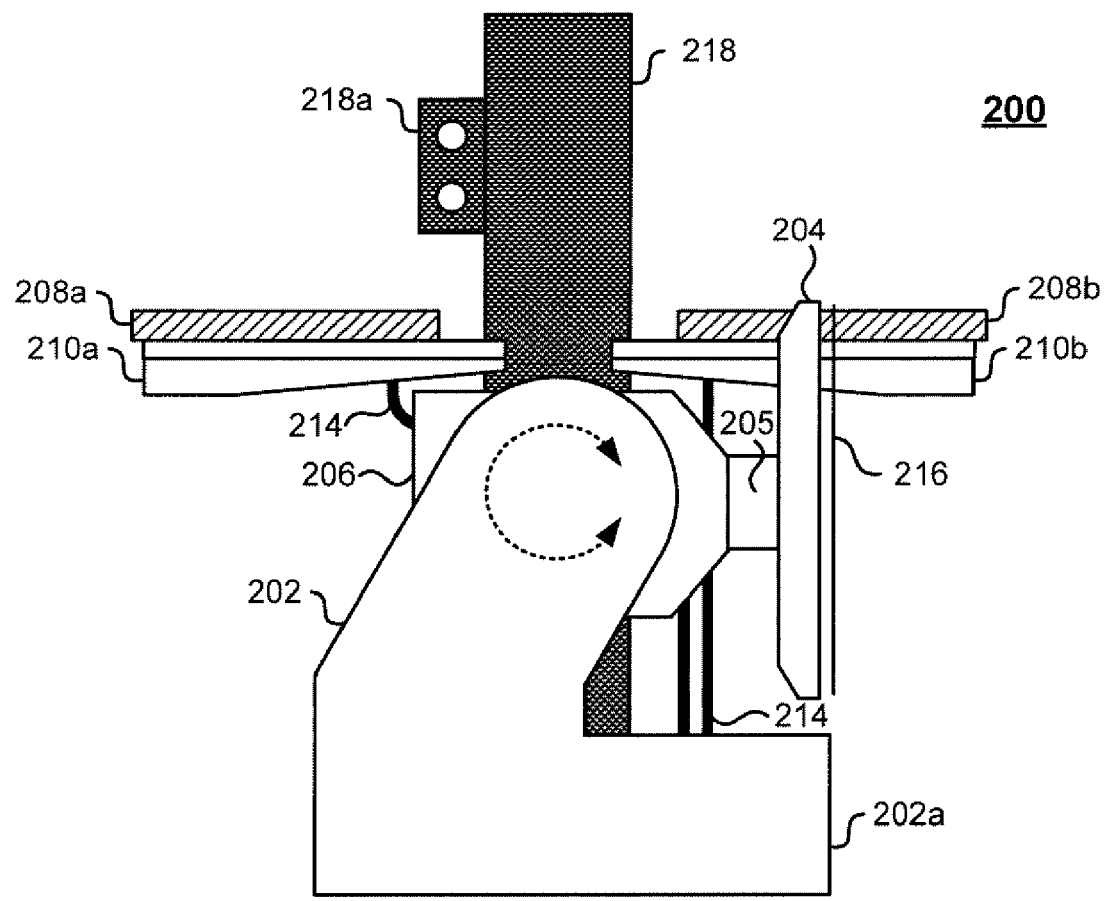
Figure 2G:
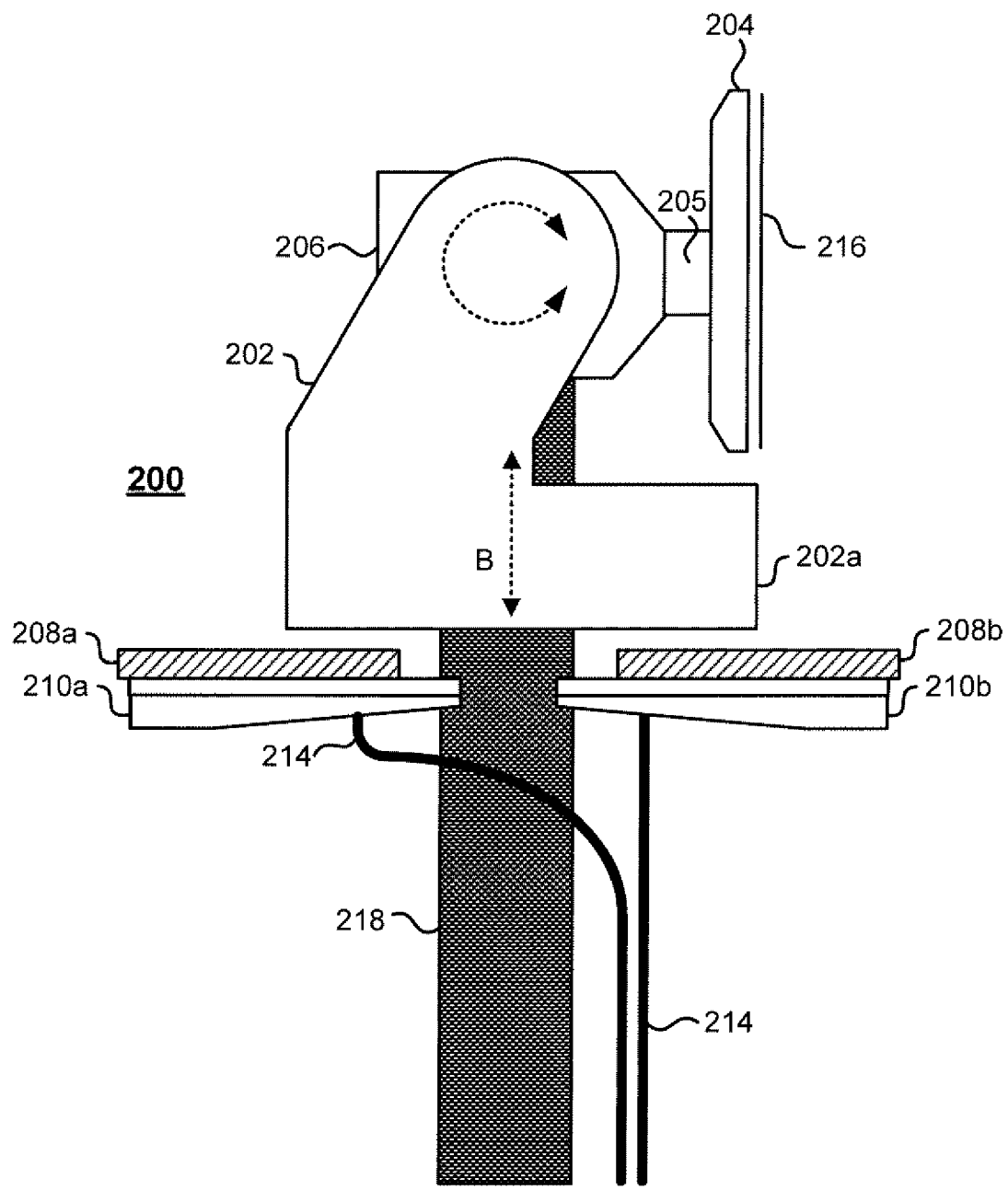
Figure 2H:
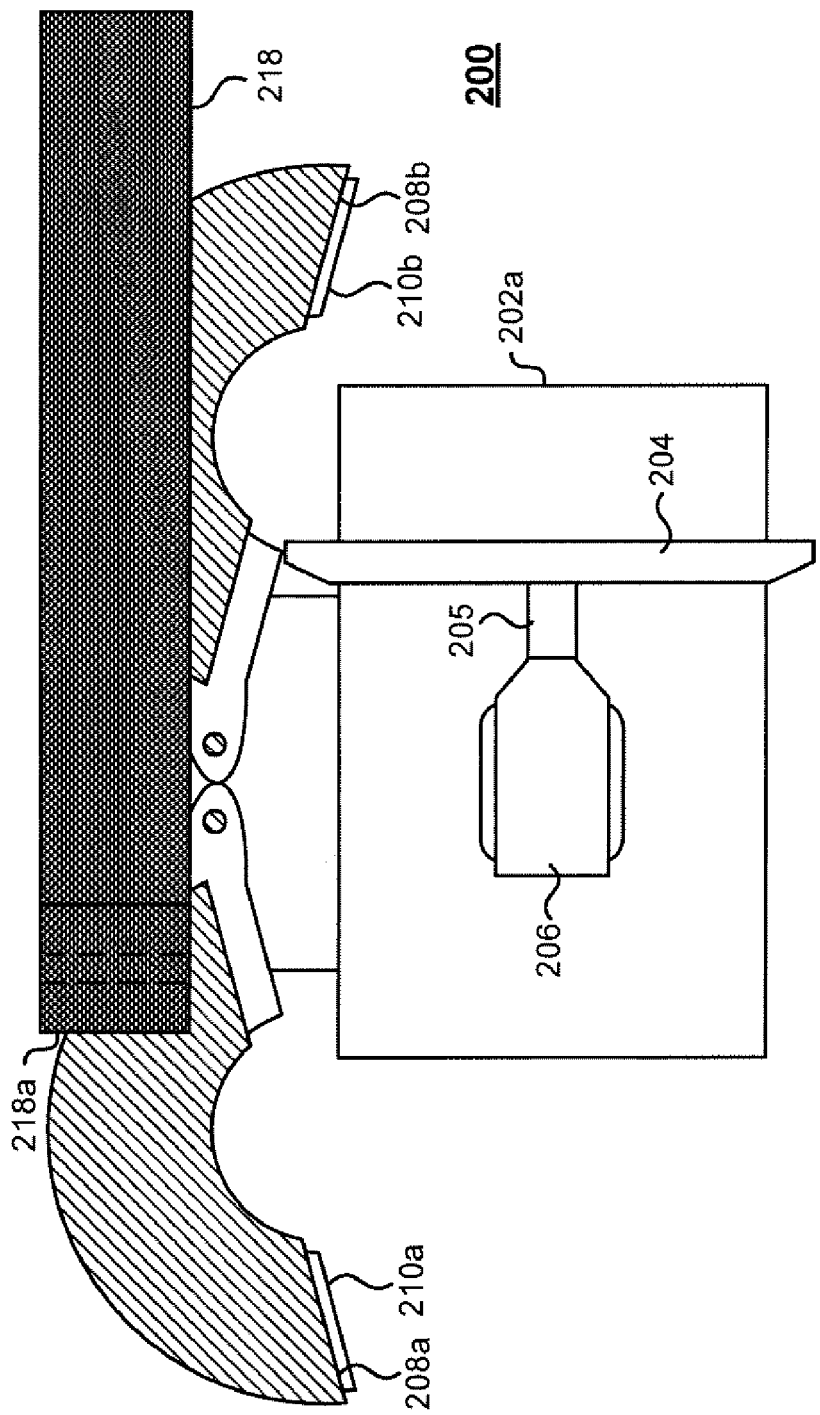

For example, FIG. 2F depicts a side view of the apparatus 200 for changing temperature of the platen 204 in implant position. FIG. 2G depicts a side view of the apparatus 200 in an implant position. In one embodiment, for example, the implant position may require the entire roplat 202 to be positioned above the cooling pads 208*a*, 208*b*, as shown by arrow B, which may be a similar linear movement describe above with respect to FIG. 2C. Other various embodiments may also be provided. FIG. 2H depicts a top view of the apparatus 200 corresponding to FIGS. 2F-2G.

Ion implantation may continue for as long as necessary or until the platen requires cooling. If additional cooling is required, the cycle may repeat as needed. In order to convert back to normal room temperature implant operation, thermal fluid flow to the thermal pads 208*a*, 208*b* may be reduced/stopped and the platen 204 may be allowed to warm up to normal room temperature operation (e.g., a temperature above 0° C.). In one embodiment, this may be achieved by letting the platen 204 warm up on its own. In another embodiment, heating may be accelerated by using a heated thermal fluid rather than coolant in the technique described above. Once the platen 204 is warm, the conventional platen cooling system may be restored and warm implants may resume.

It should also be appreciated that the apparatus 200 with movable thermal pads 208*a*, 208*b* may allow for smooth transition between a cooling/heating position and an implant position. In one embodiment, a cooling/heating position may be any position where the platen 204 may be cooled/heated by the thermal pads 208*a*, 208*b*. In another embodiment, an implant position may be any position where the platen 204 is extends away from the thermal pads 208*a*, 208*b*. Other various embodiments may also be realized.

FIGS. 3A-3D depict an apparatus 300 for changing temperature of a platen in accordance with another exemplary embodiment of the present disclosure. Similar to FIGS. 2A-2H, the apparatus 300 of FIGS. 3A-3D may include a roplat 202 having a base 202*a*, and a platen 204. As thermal fluid flows through the thermal pads 308*a*, 308*b*, a wafer 216, which may be placed on the platen 204, may be cooled/heated to a desired temperature.

Figure 3B:
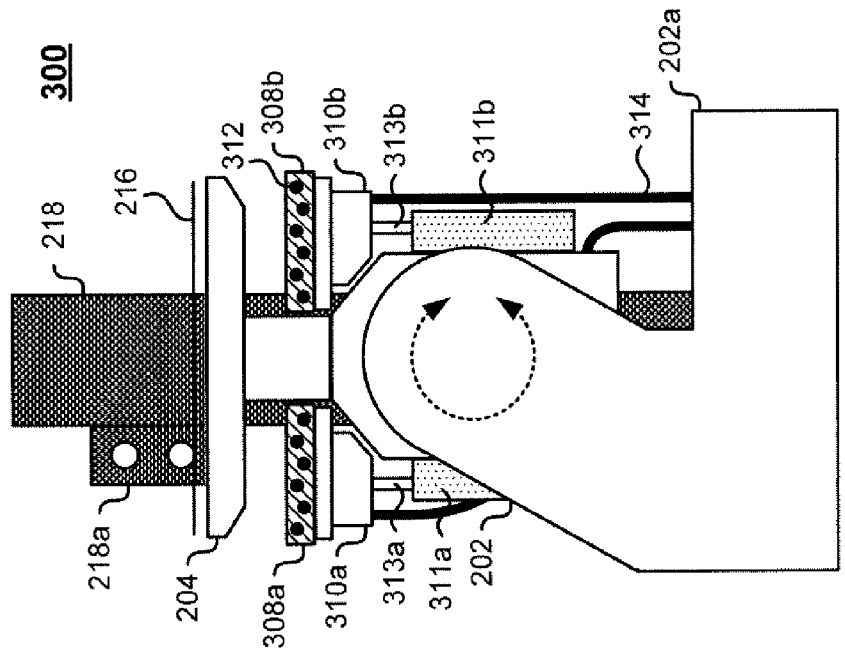
FIGS. 3A-3D depict an apparatus for changing temperature of a platen in accordance with another exemplary embodiment of the present disclosure.
Figure 3A:
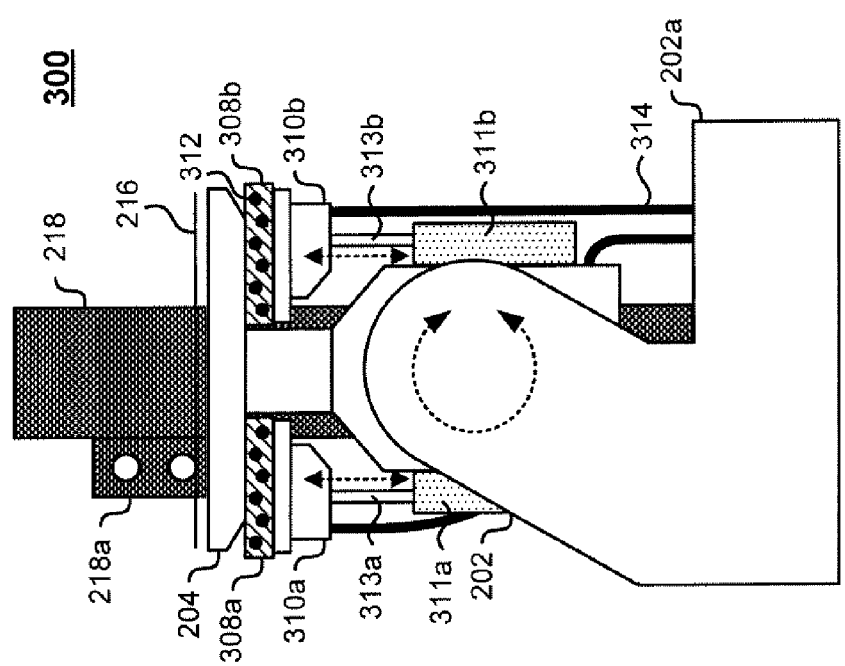

However, unlike FIGS. 2A-2H, the thermal pads 308*a*, 308*b* of the apparatus 300 may be placed on and supported by moveable platforms 310*a*, 310*b*. Referring to FIG. 3A, a side view of an apparatus 300 for changing temperature of a platen is depicted in accordance with an embodiment of the present disclosure. In this example, rather than using movable arms, the thermal pads 308*a*, 308*b* may be supported by movable platforms 310*a*, 310*b* in a compliant mounting system using linear actuators 311*a*, 311*b*. It should be appreciated that thermal channels 312 in the thermal pads 308*a*, 308*b* may connect to one or more thermal pipes 314, which are in turn connected to a thermal fluid source and/or drain (not shown) via mounting frame 218. The thermal pads 308*a*, 308*b* may include the thermal channels 312 for thermal fluid to flow within the thermal pads 308*a*, 308*b*.

Actuating arms 313*a*, 313*b* connected to the linear actuators 311*a*, 311*b* may extend or retract the thermal pads 308*a*, 308*b*. Contact pressure may be applied by a pushing force when the thermal pads 308*a*, 308*b* are extended by the linear actuators 311*a*/311*b* via the actuating arms 313*a*, 313*b*.

In an extended position, as depicted in FIG. 3A, contact pressure may be created between the surface of the thermal pads 308*a*, 308*b* and the underside of the platen 204 to provide cooling/heating to the platen 204. In one embodiment, cooling/heating of the platen 204 may be achieved by contact heat transfer. For example, as the thermal fluid passes through the thermal channels 312 within the thermal pads 308*a*, 308*b*, heat from the platen 204 may be transferred to the thermal fluid in the thermal pads 308*a*, 308*b*. FIG. 3B depicts a side view of the apparatus 300 for changing temperature of the platen 204 where the thermal pads 308*a*, 308*b* are in a retracted position.

It should be appreciated that, similar to FIGS. 2A-2H, thermal resistance between the metal-to-metal contact of the platen 204 and the thermal pads 308*a*, 308*b* may be lowered by introducing a small gas flow into the contact areas. The small gas flow may be helium, nitrogen, clean dry air (CDA), or other similar gases. By introducing a small gas flow, the heat transfer may be increased between the thermal pads 308*a*, 308*b* and the platen 204 to facilitate changing the temperature of the platen 204 to the desired temperature. Other various embodiments may also be realized.

Figure 3C:
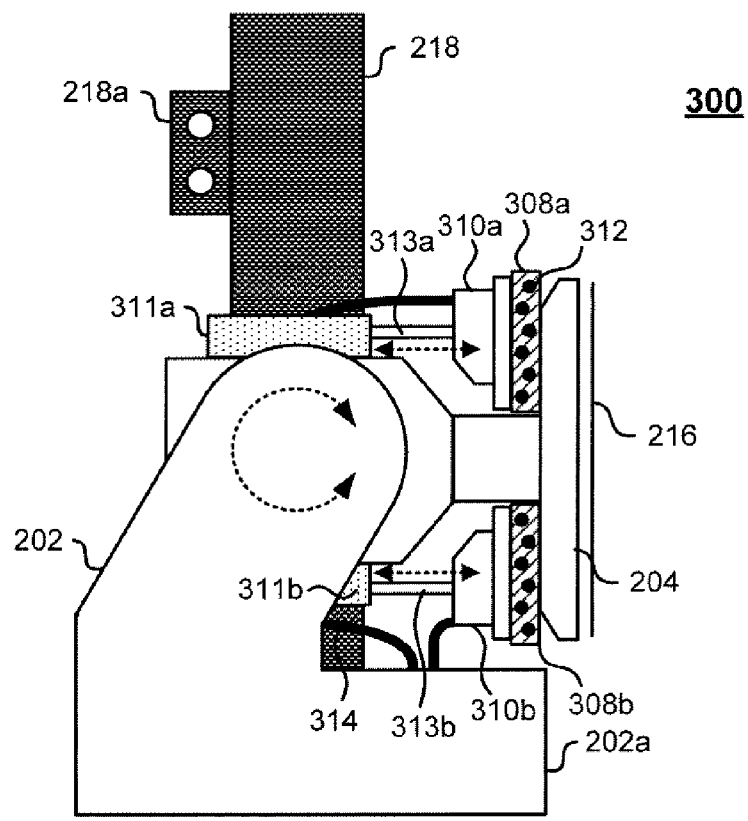
Figure 3D:
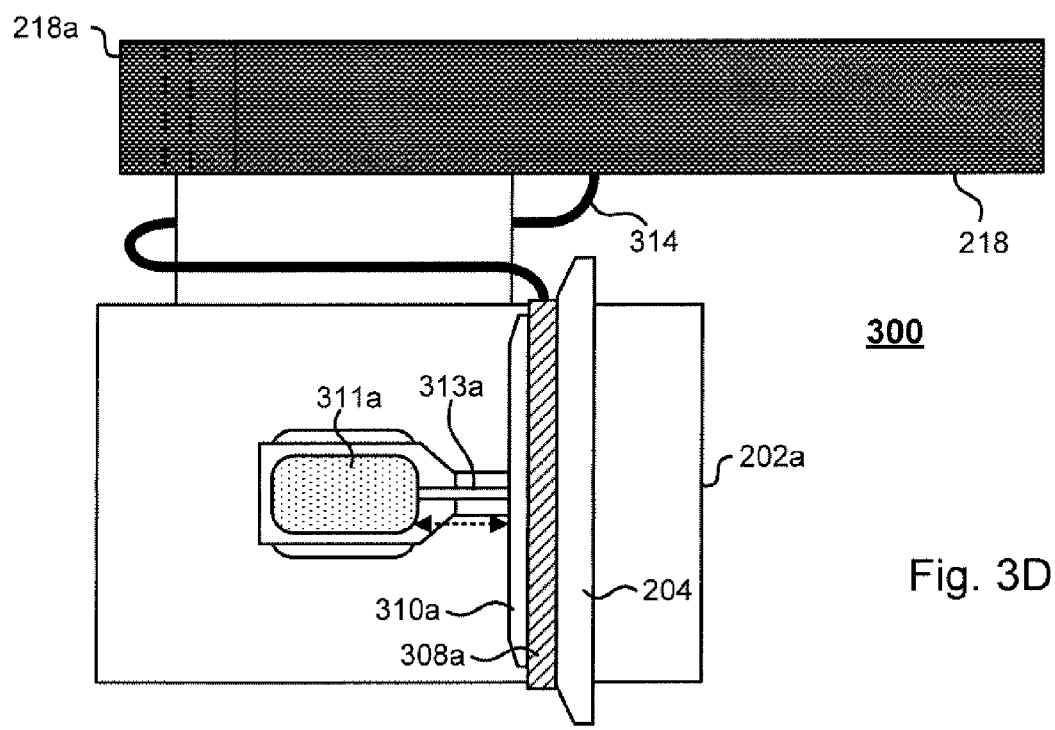

There are several advantages associated with using linear actuators 311*a*, 311*b* to extend/retract the thermal pads 308*a*, 308*b*. First, for example, the thermal pads 308*a*, 308*b* may be operated independently of each other. This may provide a more customized cooling/heating effect in the event that only part of the platen 204 needs to be cooled/heated. Second, unlike the thermal pads 208*a*, 208*b* of apparatus 200, which may be operated only during breaks in ion implantation, the thermal pads 308*a*, 308*b* of apparatus 300 may be used to change a temperature of the platen 204 during ion implantation. For example, FIG. 3C depicts a side view of apparatus 300 in an implant mode. In this view, it may be shown more clearly that the linear actuators 311*a*, 311*b* may continue to extend/retract at any angle tilt of the roplat 202 and platen 204. FIG. 3D depicts a top view of apparatus 300 corresponding to FIG. 3C.

An advantage associated with embodiments of the present disclosure, as discussed above, may include cooling/heating functions and features in normal room temperature mode and/or in a reduced throughput cooled/heated implant mode. Another advantage of the cooling/heating functions and features is that embodiments of the present disclosure may not require any additional changes to conventional ion implantation methods. For example, an apparatus according to embodiments of the present disclosure may be easily attached to an ion implanter by using the mounting frame 218. Another benefit associated with embodiments of the present disclosure may be that contact cooling/heating using thermal pads removes a need for plumbing thermal fluid (e.g., cryogenic coolants, etc.) directly to or in a platen or other associated components (e.g., chuck, etc.). As described above, most platens were never designed for this purpose and therefore adverse effects resulting from such use may decrease wafer processing quality, which may be cumbersome and expensive, if not hazardous, to ion implantation performance.

Additionally, the cooling/heating functions and features as disclosed may be customized to be proportional with implant energy delivered to a wafer and platen. For example, in a cooling embodiment, an aluminum platen may have a thermal capacitance of approximately 3000 Joules/° C. A $1\times10^{15}$ ions/cm$^2$ at 20 keV implant may be approximately 3000 Joules, which may yield a 1.0° C. temperature increase in the platen and wafer together. Alternatively, in another embodiment, a $1\times10^{16}$ ions/cm$^2$ at 10 keV implant may be approximately 15,372 Joules, which may yield a 5.0° C. temperature increase in the platen and wafer together. Accordingly, when using an upper limit of −60° C. for the wafer temperature and a cooling set point of −80° C., for example, for the cooled platen, up to four (4) implants (e.g., 4×5° C.=20° C.) may be achieved before the apparatus for cooling the platen 204 would need to be activated.

It should be appreciated that embodiments of the present disclosure may be used in various ion implanters, e.g., as an option in high current, medium current, and/or high energy ion implanters.

It should also be appreciated that embodiments of the present disclosure may enhance wafer processing in ion implantation. For example, increased device speed and/or reduce leakage currents may be achieved in devices (e.g., volatile and non-volatile memory devices) manufactured using the apparatus and methods described above.

It should be appreciated that while embodiments of the present disclosure are directed primarily to cooling a platen, other implementations may be provided as well. For example, techniques for cooling other various components may be realized as well. This may include ion source, measuring devices, etc.

It should be appreciated that other thermal conditioning applications may also be realized. For example, embodiments of the present disclosure may use heated thermal fluid to increase temperature, rather than decrease temperature. This may be useful in switching between normal room temperature implantation and low/high temperature implantation. It should also be appreciated that a dynamic combination of cooling and heating may be implemented as well. Such a thermal conditioning system may maintain temperature by dynamically determining whether cooling or heating is required. This may be important in ion implantation processes where maintaining temperature is vital to optimize implantation. Other various embodiments may also be provided.

It should also be appreciated that embodiments of the present disclosure may apply other ion implantation systems as well, such as plasma-based ion implantation systems. These may include radio frequency plasma doping (RF-PLAD) systems, glow discharge plasma doping (GD-PLAD) systems, and other similar systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus comprising:
an ion source configured to generate ions;
a platen to support a wafer for ion implantation with the ions; and
one or more movable thermal pads retractable away from the platen, the one or more movable thermal pads comprising one or more thermal fluid channels to carry a coolant configured to reduce a temperature of the platen so the temperature of the platen is below 0° C. during the ion implantation.

2. The apparatus of claim 1, wherein the one or more movable thermal pads are retractable in a direction parallel to a planar surface of the platen.

3. The apparatus of claim 1, wherein the one or more movable thermal pads are retractable in a direction orthogonal to a planar surface of the platen.

4. The apparatus of claim 1, wherein the one or more movable thermal pads are independently controlled.

5. The apparatus of claim 1, wherein the temperature of the platen is affected when the one or more movable thermal pads are in thermal contact with the platen.

6. The apparatus of claim 1, wherein the platen and the one or more movable thermal pads are made of an electrostatic material.

7. The apparatus of claim 6, wherein the electrostatic material comprises at least one of aluminum and alumina.

8. The apparatus of claim 1, wherein the coolant comprises at least one of helium, nitrogen, a refrigerant liquid, and a cryogenic liquid.

9. A method for changing temperature of a platen, comprising:
implanting ions into a wafer supported by a platen;
feeding one or more thermal fluid channels of one or more movable thermal pads with a coolant;
moving the one or more thermal pads to thermally contact the platen to reduce a temperature of the platen so the temperature of the platen is below 0° C. during the implanting operation; and
retracting the one or more thermal pads when a desired temperature is obtained.

10. The method of claim 9, further comprising introducing a small gas flow into areas where the one or more thermal pads thermally contact the platen to reduce thermal resistance and improve heat transfer.

11. The method of claim 9, wherein the one or more thermal pads are retracted away from the platen in a direction parallel to a planar surface of the platen.

12. The method of claim 9, wherein the one or more thermal pads are retracted away from the platen in a direction orthogonal to a planar surface of the platen.

13. The method of claim 9, wherein the one or more thermal pads are independently controlled.

14. The method of claim 9, wherein the platen and the one or more thermal pads are made of an electrostatic material.

15. The method of claim 14, wherein the electrostatic material comprises at least one of aluminum and alumina.

16. The method of claim 9, wherein the thermal fluid is a coolant comprising at least one of helium, nitrogen, a refrigerant liquid, and a cryogenic liquid.

17. The method of claim 9, wherein the temperature of the platen is decreased to between −10° C. to −100° C.

* * * * *